United States Patent
Calvert

(10) Patent No.: US 12,183,508 B2
(45) Date of Patent: Dec. 31, 2024

(54) SUPPORT STRUCTURE FOR SUPERCONDUCTING COIL

(71) Applicant: Siemens Healthcare Limited, Camberley (GB)

(72) Inventor: Simon James Calvert, Chipping Norton (GB)

(73) Assignee: Siemens Healthcare Limited, Camberley (GB)

( * ) Notice: Subject to any disclaimer, the term of this patent is extended or adjusted under 35 U.S.C. 154(b) by 349 days.

(21) Appl. No.: 17/763,707

(22) PCT Filed: Jul. 16, 2020

(86) PCT No.: PCT/EP2020/070143
§ 371 (c)(1),
(2) Date: Mar. 25, 2022

(87) PCT Pub. No.: WO2021/058163
PCT Pub. Date: Apr. 1, 2021

(65) Prior Publication Data
US 2022/0406503 A1  Dec. 22, 2022

(30) Foreign Application Priority Data
Sep. 26, 2019 (GB) .................................. 1913854

(51) Int. Cl.
*H01F 6/06* (2006.01)
*G01R 33/38* (2006.01)
*G01R 33/3815* (2006.01)
*G01R 33/421* (2006.01)

(52) U.S. Cl.
CPC ........... *H01F 6/06* (2013.01); *G01R 33/3802* (2013.01); *G01R 33/3815* (2013.01); *G01R 33/421* (2013.01); *H01F 6/065* (2013.01)

(58) Field of Classification Search
CPC ....... H01F 6/06; H01F 6/065; G01R 33/3802; G01R 33/3815; G01R 33/421
See application file for complete search history.

(56) References Cited

U.S. PATENT DOCUMENTS

| | | |
|---|---|---|
| 5,329,266 A | 7/1994 | Soeldner et al. |
| 5,668,516 A | 9/1997 | Xu et al. |
| 7,883,656 B2 | 2/2011 | Calvert |
| 2009/0174513 A1 | 7/2009 | Ford et al. |

(Continued)

FOREIGN PATENT DOCUMENTS

| | | |
|---|---|---|
| CN | 102314987 A | 1/2012 |
| CN | 108695037 A | 10/2018 |

(Continued)

OTHER PUBLICATIONS

Apr. 16, 2020—(GB) Search and Examination Report—App No. 1913854.4.

(Continued)

*Primary Examiner* — Ramon M Barrera
(74) *Attorney, Agent, or Firm* — Banner & Witcoff Ltd.

(57) ABSTRACT

An assembly of supported superconducting coils may include support structure including a flexible mounting band attached to a surface of a coil and which extends axially beyond the radially outer surface of the coil. The flexible mounting band may be attached to a support structure at multiple locations. The coil may be attached to one or more other coils by the flexible mounting band.

16 Claims, 3 Drawing Sheets

(56) References Cited

U.S. PATENT DOCUMENTS

Figure 3:
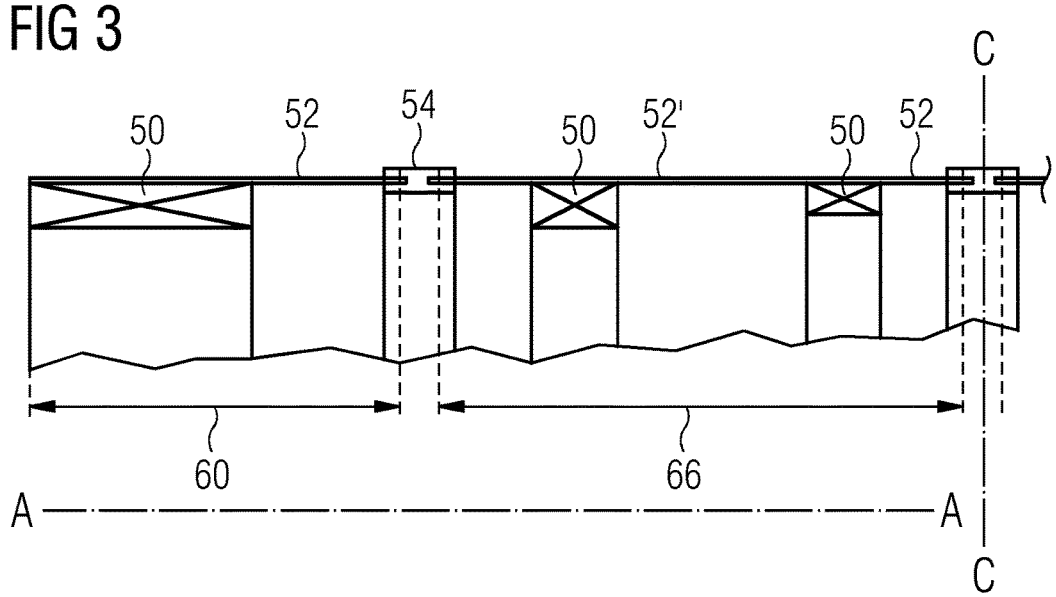

| | | |
|---|---|---|
| 2011/0291782 A1 | 12/2011 | Calvert |
| 2012/0214674 A1 | 8/2012 | Blakes et al. |
| 2017/0097397 A1 | 4/2017 | Jonas et al. |
| 2017/0229239 A1 | 8/2017 | Davis et al. |
| 2017/0248667 A1 | 8/2017 | Calvert et al. |
| 2018/0286572 A1 | 10/2018 | Noys |

FOREIGN PATENT DOCUMENTS

| | | |
|---|---|---|
| GB | 2326527 A | 12/1998 |
| GB | 2489126 A | 9/2012 |
| GB | 2528947 A | 2/2016 |
| JP | H04287903 A | 10/1992 |
| JP | H09283322 A | 10/1997 |
| JP | H1145807 A | 2/1999 |
| JP | 2014099642 A | 5/2014 |
| WO | 2013/102509 A1 | 7/2013 |
| WO | 2014103827 A1 | 7/2014 |
| WO | 2015/177667 A2 | 11/2015 |
| WO | 2016/066526 A1 | 5/2016 |

OTHER PUBLICATIONS

Nov. 9, 2020—(WO) International Search Report & Written Report—PCT/EP2020/070143.

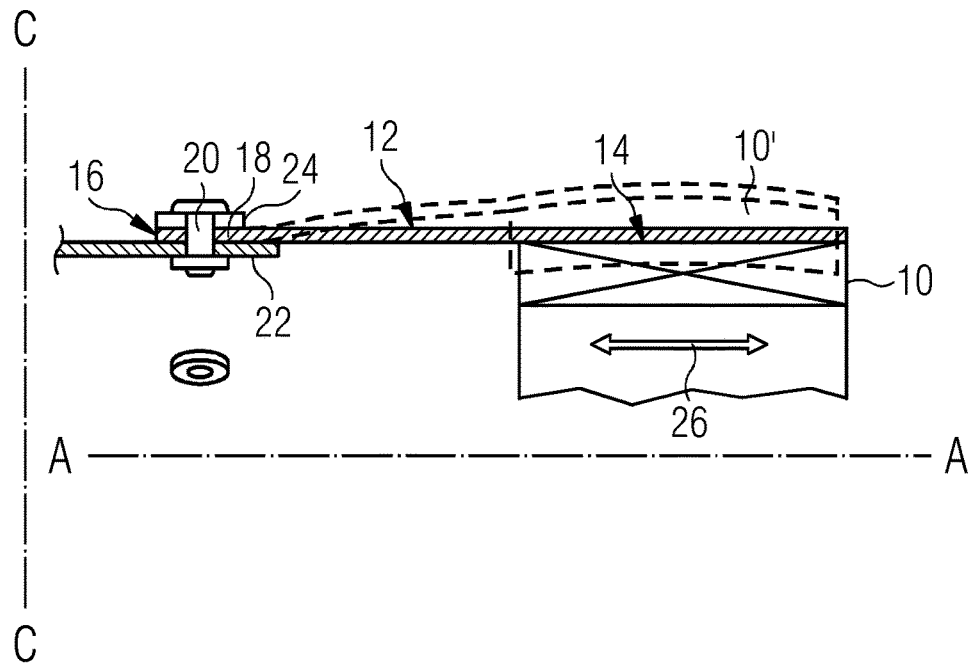
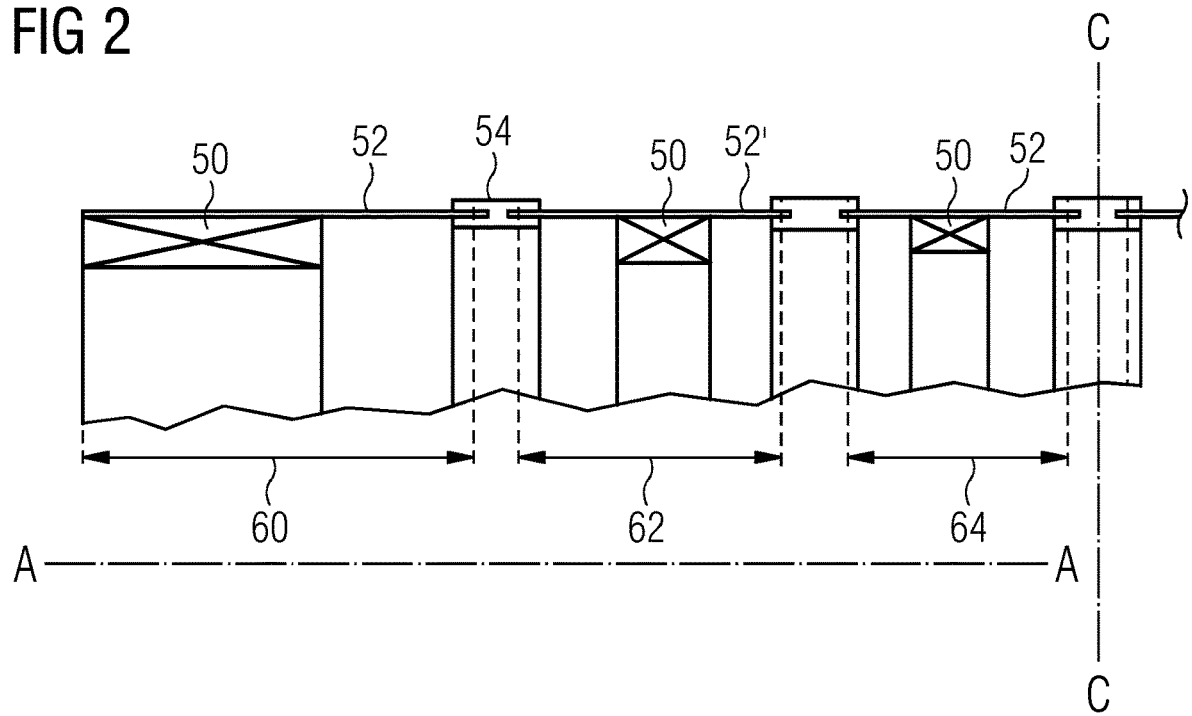

SUPPORT STRUCTURE FOR SUPERCONDUCTING COIL

CROSS REFERENCE TO RELATED APPLICATIONS

This is a U.S. National Stage Patent Application of PCT/EP2020/070143, filed Jul. 16, 2020, which claims priority to Great Britain (GB) Patent Application No. 1913854.4, filed Sep. 26, 2019. Each of these applications is incorporated herein by reference in its entirety.

BACKGROUND

Field

The present disclosure relates to support structures for superconducting coils, and particularly to support structures for light weight, flexible superconducting coils.

Related Art

Conventionally, many superconducting magnets such as used in Magnetic Resonance Imaging (MRI) or Nuclear Magnetic Resonance (NMR) systems include main magnet coils which generate a strong, static magnetic field, and shield coils of greater diameter than the main magnet coils which typically carry current in the opposite direction than current in the main magnet coils. The shield coils reduce the amount of stray field emitted by the magnet. To be effective, the shield coils tend to be radially separated from the main magnet coils by a substantial radial gap. To be effective in shielding the stray field, the shield coils must be accurately positioned. In use, such shield coils may be subjected to axial body forces of many tonnes. It is therefore necessary to provide a support structure for such shield coils which is capable of resisting such axial loading yet retains the shield coils accurately and repeatedly in the required positions. The support structure also needs to be lightweight and cost-effective in order to meet current drives to minimise liquid cryogen inventory and consumption, minimise transport costs and material consumption.

Conduction-cooled magnets, those which do not rely on a bath, or circulating mass, of cryogen, require that the "cold mass" of the superconducting magnet should be kept low. The "cold mass" includes all components of the superconducting magnet that are, in use, at the operating temperature of superconducting coils. Therefore, it will include the superconducting coils themselves, support structures, electrical connections and equipment attached to the support structures.

Where cold mass is limited, the material of the coils is reduced in wire dimension and conventional formers may be reduced in dimension or eliminated altogether. Coils therefore become quite thin and lose much of their inherent stiffness, making supporting such coils much more difficult. Issues such as transportation, interaction between coils, and iron in the vicinity of the magnet need greater consideration than in the case of conventional magnet structures. As the reduced-mass coils may be flexible to some degree, it is preferable that the coils should not be subject to mechanical point loading. That is to say, the coils should not be restrained only at a few positions around their circumference since the resulting mechanical point-loading in operation would lead to deformation of the coil.

Conventional mounting and stiffening arrangements, such as rigid coil formers or wire of large cross-section are not suitable for use in superconducting magnet structures which seek to minimise mass, material consumption and cooling requirements.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIGS. 1-3 show respective example structures according to exemplary embodiments of the present disclosure, in part-radial, part-axial cross section.

Figure 4:
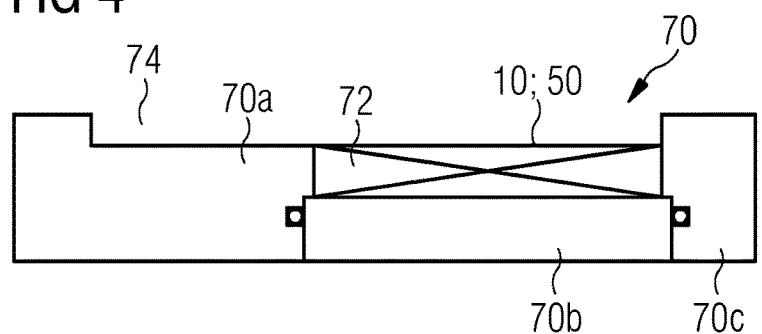
Figure 5:
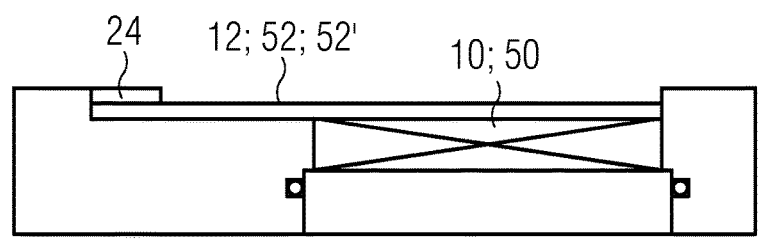
Figure 6:
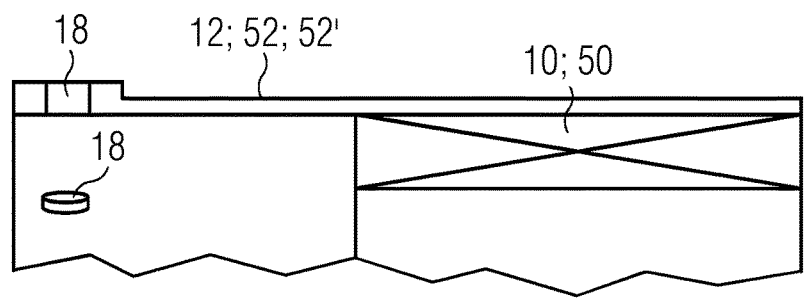

FIGS. 4-6 schematically represent stages in a manufacturing process, itself according to an exemplary embodiment of the present disclosure, of manufacturing coils with flexible mounting band, according to exemplary embodiments of the present disclosure.

Figure 7:
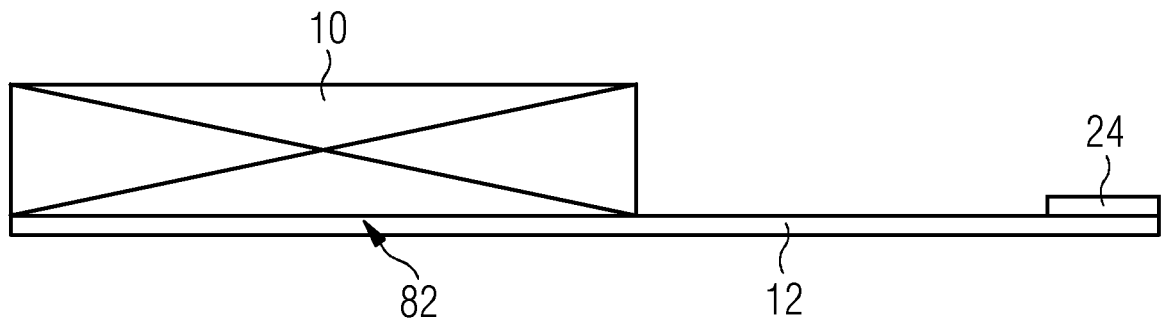

FIG. 7 schematically represents an alternative structure according to an exemplary embodiment of the disclosure, in analogous manner to the representation of FIG. 1.

Figure 8:
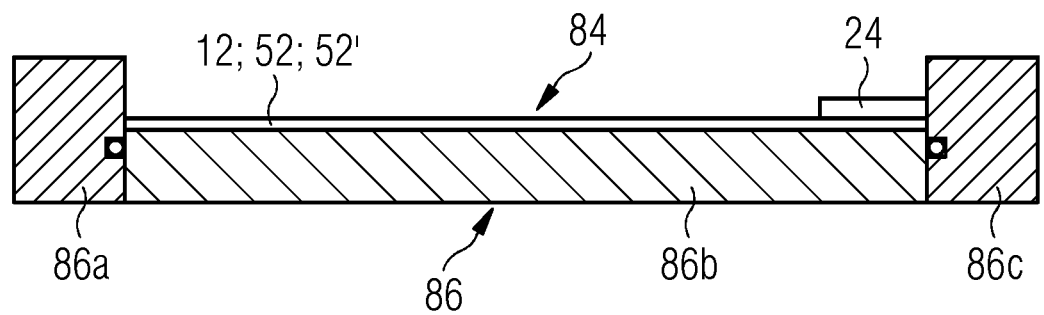
Figure 9:
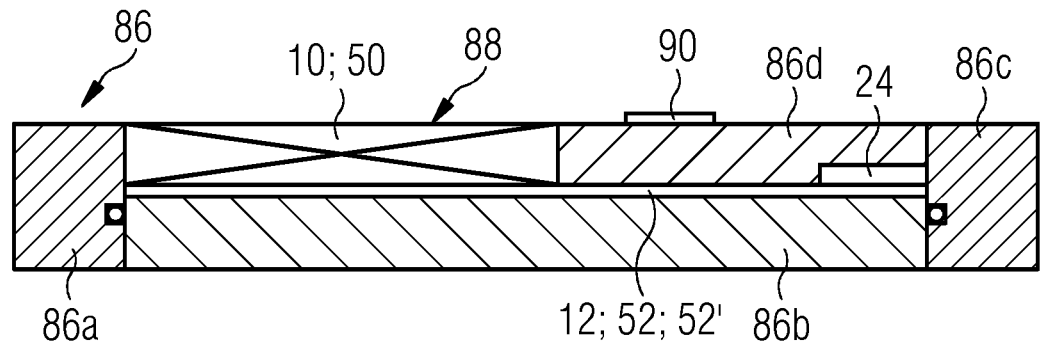

FIGS. 8 and 9 represent operations in a method for manufacture of an article, as represented in FIG. 7, according to an exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, and components have not been described in detail to avoid unnecessarily obscuring embodiments of the disclosure.

The present disclosure therefore provides support structures for superconducting coils, and methods for supporting superconducting coils, such that mass and material consumption is minimised, mechanical interaction with other components are minimised, and such that the coil is supported at many locations around its circumference. Using the methods and apparatus of the present disclosure, relatively thin and flexible coils may be mounted to stiff supporting structures without concerns as to the reliability of operation of the coils.

The present disclosure provides methods and apparatus for interfacing thin, flexible coils to a stiff support structure in such a manner that stress concentrations are avoided and provides continuous or near-continuous support around the circumference of the supported coil. This is achieved with a structure of little mass and may be found usefully applicable to superconducting magnet arrangements which include no, or little, cryogen material, in which the low structural mass enables relatively fast cooling and re-cooling to operating temperature.

Current and future designs of superconducting magnet are also likely to feature low-mass, flexible superconducting coils as main magnet coils too, so the methods and structures of the present disclosure may be applied to both main magnet coils and shield magnet coils.

FIG. 1 schematically represents a part-axial, part-radial cross section of an embodiment of the present disclosure. The structure is essentially rotationally symmetrical about axis A-A (schematically represented) and reflectionally symmetrical about centre line C-C (schematically represented). In the present description, references to "axial" and similar terms indicate directions parallel to axis A-A, while references to "radial" and similar terms indicate directions perpendicular to axis A-A.

Coil 10 is a thin, flexible coil. It may be a shield coil, and in the present description, may be referred to as a shield coil, although the present disclosure extends to embodiments incorporating main magnet coils and indeed any magnet coil.

According to a feature of the present disclosure, a flexible mounting band 12 is attached to the radially outer surface 14 of the coil 10 and extends axially beyond the surface of the coil. In the illustrated embodiment, the flexible mounting band 12 extends over the whole radially outer surface of the coil 10. In other embodiments of the disclosure, the band does not extend over the whole radially outer surface, but over sufficient width to provide the necessary mechanical interface strength. In the illustrated embodiment, multiple holes 18 are formed through the flexible mounting band 12. In an exemplary embodiment the holes 18 are located near to an axial extremity thereof for the purpose of mounting the flexible mounting band 12 to a support structure, for example, by rivets or bolts. In other embodiments, not separately illustrated, the flexible mounting band 12 could alternatively, or additionally, be adhesively bonded or mechanically clamped to a support structure rather than being rivetted or bolted. These methods would provide continuous support and would further minimise stress concentrations which might occur in embodiments where the supporting structure is intermittently supported, for example by bolts or rivets.

In the embodiment of FIG. 1, near the axially inner extremity 16 of the flexible mounting band 12, multiple holes 18 are formed. A fastener 20, such as a rivet or a bolt, is provided through each hole 18 and serves to attach the mounting band 12 to a support structure 22 at multiple locations. The number of holes 18 and fasteners 20 is chosen to be at least sufficient that the coil 10 does not suffer point loading sufficient to cause deformation in use. In certain embodiments, a reinforcement band 24 is provided over a part of the flexible mounting band 12, sufficient to cover the axial extent of the holes 18 and a region around the holes, to provide support to the fasteners 20. Holes 18 extend through the reinforcement band. If the reinforcement band is sufficiently strong, and/or the holes 18 and fasteners 20 sufficiently numerous, reinforcement band 24 may be found unnecessary. However, the advantages of the present disclosure are best obtained when the flexible mounting band 12 is lightweight.

The support structure 22 may be any conventional or suitable support structure. In embodiments where coil 10 is a shield coil, support structure 22 may be mounted to a main magnet structure, to a cryogen vessel or a vacuum vessel (Outer Vacuum Chamber "OVC"). In embodiments where coil 10 is a main magnet coil, support structure 22 may be mounted to a cryogen vessel or OVC.

In use, coil 10 experiences significant axial forces, illustrated by the arrow 26. Depending on the magnet design, the axial forces represented at 26 may act toward, or away from, the axial mid-plane C-C of the magnet.

In use, the coil 10 and the remainder of the cold mass is cooled to superconducting operating temperature, typically 20K or less, usually about 4K. The axial force 26 experienced by coil 10, in conjunction with hoop stresses experienced as tension in the annular coil 10 and differences in thermal expansion will cause coil 10 and flexible mounting band 12 to displace relative to support structure 22, to an active position 10' as represented in phantom. As represented in FIG. 1, the forces acting on coil 10 may cause it to deform, in the illustrated example by barrelling outward. In other embodiments, coil 10 may barrel inwards, or deform conically. During design of the superconducting magnet, the extent and position of such deformation and movement may be modelled by computer modelling software well known to those skilled in the art, and operation of the magnet may be simulated with coil 10 in its "active" position 10'. In an exemplary embodiment, flexible mounting band 12 is relatively stiff in the axial direction but relatively compliant in the radial direction. One or more additional stiffening bands, not illustrated, may be added along the axial length of the flexible mounting band to resist buckling of the flexible mounting band under axial compressive loading while still maintaining radial compliance.

In embodiments of the disclosure in which coil 10 is cooled by contact with liquid and/or gaseous cryogen, the structure of the present disclosure may be found to be advantageous since the whole surface of the coil 10 is cooled by contact with the cryogen, as flexible mounting band 12 may be relatively thin and thermally conductive.

Flexible mounting band 12 is relatively thin and flexible under forces experienced by coil 10. The flexible mounting band 12 is bonded to a radially outer surface of coil 10 and serves as a means for attaching the coil 10 to a support structure. In other embodiments, described in more detail below, the coil 10 may be attached to one or more other coils by flexible mounting band 12, such other coil(s) also being provided with similar flexible mounting band(s). In other alternative embodiments, also described in more detail below, the flexible mounting band 12 is bonded to a radially inner surface of coil 10.

The radial compliance of the flexible mounting band 12 allows the coil 10 to expand relative to the support structure 22 without introducing excessive interface stresses between the coil 10 and the flexible mounting band 12. Because the flexible mounting band 12 is connected at many points, or continuously, and the coil 10 is continuously connected to the flexible mounting band 12, the coil is held round by the supporting structure 22. Such coil support is found capable of resisting the substantial transverse forces which result from transportation shocks, and electromagnetic (EM) loads, for example which derive from nearby iron shielding plates.

In certain embodiments of the present disclosure, the flexible mounting band 12 is attached to support structure 22 by a continuous mechanical connection. This may be by means of a resin-impregnated overbind of glass fibre cloth or carbon fibre cloth, or by welding, brazing or similar, or adhesive bonding, depending on the materials used.

A quench in the superconducting magnet is a very severe load case, especially for thin coils, wherein the coil 10 may heat up substantially relative to the supporting structure 22.

In the context of the present disclosure as represented by the embodiment of FIG. 1, the radially compliant flexure provided by flexible mounting band 12 can accommodate the relative change in position due to differential thermal expansion without mechanically stressing the coil 10.

The mechanical interface between the coil 10 and the supporting structure 22 is effectively at the fasteners 20, distant from the coil. Any mechanical movement of the coil relative to the support structure 22 will be taken up by movement between flexible mounting band 12 and supporting structure 22, distant from coil 10. Conversely, any mechanical movement between flexible mounting band 12 and supporting structure 22 for any other reason, will also take place distant from coil 10 and heat generated by friction in any such movement will not reach coil 10 and will not cause coil quench.

The flexible mounting band 12 is a radially compliant flexural support which avoids the introduction of stress concentrations into coil 10 due to events such as cool down, energization or quench. The flexible mounting band 12 is stiff in the axial and azimuthal directions and is thus able to resist EM and shipping loads.

The disclosure accordingly provides a coil support method which is particularly suitable for very thin coils. The coil support of the present disclosure supports the coil at many azimuthal locations thus preventing the coil going out of round or buckling. In exemplary embodiments, the coil support method adds very little cost or structural mass to the superconducting magnet. Stick-slip initiation of quenches is avoided by the structure of the present disclosure, since any stick-slip events will take place well away from the coil itself.

FIG. 2 shows another embodiment of the present disclosure, in which main magnet coils 50 are each attached to a flexible mounting band 52 in a similar manner to that described with reference to the embodiment of FIG. 1. In the case of end coils, such as shown on the left-hand side of FIG. 2, the flexible mounting band 52 extends axially beyond the axially inner extremity of the associated coil 50. In the case of the other (inner) coils, the flexible mounting band 52 extends axially beyond both axial extremities of the coil 50.

A first coil element 60 accordingly comprises an end coil 50 and an associated flexible mounting band 52 which extends axially beyond the axially inner extremity of the associated end coil 50. Second coil element 62 and third coil element 64 each comprise an inner coil 50 and an associated flexible mounting band 52 extends axially beyond both axial extremities of the coil 50.

Annular connectors 54 are provided between the coils, and these provide mechanical connection between the coils, in that respective flexible mounting bands 52 are attached to each annular connector 54 to join adjacent coils. The annular connectors 54 may be a composite material, machined to shape, or an aluminium extrusion formed into annular shape, or other suitable material as will be apparent to those skilled in the art of designing superconducting magnets.

The annular connectors 54 will be more rigid than the flexible mounting bands 52. The annular connectors 54 accordingly provide mechanical strength to the resulting structure and ensure that each coil is firmly supported at the axial extremity/extremities of the associated flexible mounting band 52. The annular connectors 54 may be used as loadbearing supports to retain the magnet structure within a cryostat. Supporting rods or similar may be attached to the annular connectors 54 and used to bear the weight of the cold mass.

FIG. 3 shows another embodiment, a variant of the embodiment of FIG. 2, in which two or more coils 50 are attached to a single shared flexible mounting band 52', with no annular connector 54 between those coils. A multi-coil element 66 is accordingly provided having two or more coils 50, axially spaced apart but connected to a shared flexible mounting band 52'.

The arrangements of FIGS. 2 and 3, in particular, show a coil support structure of the present disclosure which can be used to build complete very light-weight low-cost coil systems in a modular fashion. Annular connectors 54 may be purchased from any of a large number of suppliers and held as a stock item. Coils 50 may be manufactured in a required range of designs and held in stock. By making all flexible mounting bands 52, 52' of a maximum required axial dimension, different designs of magnet may be manufactured by trimming the flexible mounting bands 52, 52' to a required axial dimension prior to manufacture of a particular design.

FIGS. 4-6 illustrate stages in an example method for manufacture of a coil support structure of the present disclosure. Such methods themselves form embodiments of the present disclosure.

As shown in FIG. 4, an annular, demountable mould 70 is provided. It is composed of multiple parts, 70a, 70b, 70c in the illustrated example, which are detachable from one another in order to facilitate removal of a completed coil structure from the mould.

When assembled, the mould 70 defines a first annular cavity 72 of correct dimensions for winding a required superconducting coil, and a second annular cavity 74, at least partially overlapping the first annular cavity, and of correct dimensions for enclosing a flexible mounting band 12, 52. Optionally, the second annular cavity may be further defined to accommodate a reinforcement band 24.

In a first stage of the manufacturing process, as illustrated in FIG. 4, a coil 10; 50 is formed in first annular cavity 72 by winding multiple turns of superconducting wire. The wire may be dry wound for later resin impregnation, or may be wet wound, this is to say, coated with uncured resin such that the coil becomes resin impregnated as it is formed. In other embodiments, the coil may be wound from wire coated in a bondable thermoplastic coating, which fuses together on heating, or bondable wire coated with a material which fuses together on exposure to UV light, or layers of wire may be interleaved with a carrier material pre-impregnated with uncured resin, such composite materials being colloquially known as 'pre-preg'. Once the coil is fully wound, the process moves on to the next stage, as illustrated in FIG. 5.

In FIG. 5, a material is wound into the second annular cavity 74 to form the flexible mounting band 12; 52; 52'. The material is wound over at least part of the radially outer surface of the coil 10; 50 and extends over an axially adjacent part of the mould 70a, such that the material forms a flexible mounting band which extends axially away from the coil 10, 50 on at least one side. In embodiments of the present disclosure where the flexible mounting band 52' extends axially away from the coil 10; 50 on both axial sides, second annular cavity 74 correspondingly extends axially away from first annular cavity 72 on both axial sides to define a volume in which to form the flexible mounting band 52'.

The material used to form the flexible mounting band 12; 52; 52' may be a glass fibre cloth or filament, or a carbon fibre cloth or filament. The cloth or filament may be wound dry, for later impregnation with a resin, or may be wound wet, that is to say coated with an uncured resin so as to form a resin-impregnated flexible mounting band as it is wound, or by other arrangements for example as outlined above. Alternatively, a metal strip, such as a 1 mm thick strip of stainless steel, may be used as the material of the flexible mounting band. In an exemplary embodiment, the strip may extend the full circumference of the coil 10; 50, and its ends would overlap to a certain extent; or ends of the strip may be welded, brazed or otherwise joined into a single annular structure placed over the coil 10; 50. Such embodiments may require the addition or removal of parts of the mould 70 to allow access for a single annular structure to be placed over the coil. In other embodiments, glass fibre cloth or carbon fibre cloth, coated with an uncured resin, may be wound first over coil 10; 50, then a metal or similar band wound over the layer of cloth. Once cured, the resin will serve to bond the band to the coil, and to take up any inconsistencies in the surfaces of the band and the coil. A further layer of glass fibre cloth or carbon fibre cloth, coated with an uncured resin, may be wound over the band, to hold it in place and to provide a required mechanical stiffness where appropriate. If required, a reinforcement band 24 may be formed, typically by winding a strip of glass fibre cloth or carbon fibre cloth of appropriate width over an extremity of the flexible mounting band 12; 52; axially distant from the coil 10; 50.

In a next step, the resin is cured, and hardens into a monolithic structure enclosing the coil windings and the material of the flexible mounting band.

Next, the coil and flexible mounting band, impregnated into a monolithic resin-impregnated structure, is removed from mould 70 by dismantling the mould into its component parts 70a, 70b, 70c. Release agent may be provided to assist with this step, as will be familiar to those skilled in the art of manufacture of superconducting coils.

FIG. 6 shows the finished structure removed from the mould. Coil 10; 50 is provided with flexible mounting band 12; 52; 52', and holes 18 are formed at intervals around the circumference of the flexible mounting band. Such holes 18 pass through the reinforcement band 24, if present. The structure of FIG. 6 is ready for use in embodiments such as shown in FIGS. 2, 3.

In an alternative embodiment, illustrated in FIG. 7 and analogous to the representation of FIG. 1, flexible mounting band 12 is attached to the radially inner surface of the coil 10, rather than the radially outer surface 14 employed in the embodiment of FIG. 1. Flexible mounting band 12 is attached to the radially inner surface 82 of coil 10, with optional reinforcement band 24 on a radially outer surface of the flexible mounting band 12, axially displaced from the coil 10. FIGS. 8 and 9 illustrate steps in a method of manufacture of such a structure, analogous to the method steps described above with reference to FIGS. 4-6. In the step shown in FIG. 8, an annular cavity 84 is defined by a demountable mould tool 86 comprising parts 86a, 86b, 86c. A material is wound into the annular cavity 84 to form the flexible mounting band 12; 52; 52'. The material forms a flexible mounting band which, in the finished assembly, will extend axially away from the coil 10, 50 on at least one side. The material used to form the flexible mounting band 12; 52; 52' may be a glass fibre cloth or filament, or a carbon fibre cloth or filament. The cloth or filament may be wound dry, for later impregnation with a resin, or may be wound wet, that is to say coated with an uncured resin so as to form a resin-impregnated flexible mounting band as it is wound, or by other arrangements for example as outlined above. Alternatively, a metal strip, such as a 1 mm thick strip of stainless steel, may be used as the material of the flexible mounting band. In an exemplary embodiment, the strip may extend the full circumference of the coil 10; 50, and its ends would overlap to a certain extent; or ends of the strip may be welded, brazed or otherwise joined into a single annular structure. Such embodiments may require the addition or removal of parts of the mould 86 to allow access for a single annular structure to be placed in the annular cavity 84. In other embodiments, glass fibre cloth or carbon fibre cloth, coated with an uncured resin, may be wound first in the annular cavity 84, then a metal or similar band wound over the layer of cloth. Once cured, the resin will serve to bond the band to the coil, and to take up any inconsistencies in the surfaces of the band and the coil. A further layer of glass fibre cloth or carbon fibre cloth, coated with an uncured resin, may be wound over the band, to hold it in place and to provide a required mechanical stiffness where appropriate. If required, a reinforcement band 24 may be formed, typically by winding a strip of glass fibre cloth or carbon fibre cloth of appropriate width over an extremity of the flexible mounting band 12; 52 axially distant from the coil 10; 50 in the finished assembly.

After the material of the flexible mounting band 12; 52; 52' is located within the annular cavity 84, one or more further demountable parts 86d of the mould are installed, to define a coil cavity 88 in which coil 10; 50 will be wound over flexible mounting band 12; 52; 52'.

The coil 10; 50 is then wound into coil cavity 88 of superconducting wire, which may be wet-wound, later impregnated, co-wound with 'pre-preg' or by any other suitable method, such as those described above. The resulting structure is as shown in FIG. 9. A banding material 90 may be placed over component parts of mould part 86d to retain them in position.

The impregnating material is then caused or allowed to cure, and the resulting structure, illustrated in FIG. 7, is then removed from the mould tool by dismantling the mould tooling. Release layers or coating may be provided between the coil and the mould tool surface to assist with this process, as will be familiar to those skilled in the art. The structure, such as FIG. 7, may be assembled into magnet structures similar to those illustrated in FIGS. 2-3 in analogous manner.

In embodiments of the present disclosure where the flexible mounting band 52' extends axially away from the coil 10; 50 on both axial sides, coil cavity 88 is correspondingly formed axially away from both axial ends of annular cavity 84 by placing further mould pieces similar to those shown at 86d on both axial sides of the annular cavity 84 to define a coil cavity 88.

In other embodiments, the flexible mounting band 12; 52; 52' may alternatively, or additionally, be attached to an axially outer surface of the or each coil 10.

The present disclosure accordingly provides a coil support structure which is very simple and can be made by an adaption of normal coil manufacturing techniques. The structures and methods of the present disclosure provide minimise mass of coil support structure and also minimises undesirable mechanical interaction between coils and support structure thus reducing the risk of quenching. The structures and methods of the present disclosure provide a support structure which is highly optimised for the support of thin superconducting coils while avoiding the introduction of stress concentrations.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

The invention claimed is:

1. An assembly of supported superconducting coils, comprising:
a support structure for a superconducting coil, comprising a flexible mounting band attached to a radially outer surface of a coil and which extends axially beyond the radially outer surface of the coil, the flexible mounting band being attached to the support structure at multiple locations,
wherein the coil is attached to one or more other coils by the flexible mounting band, the one or more other coils being attached to respective flexible mounting bands.

2. The assembly of supported superconducting coils, according to claim 1, wherein each of the flexible mounting bands extends over the whole radially outer surface of the respective coil.

3. The assembly of supported superconducting coils, according to claim 1, wherein one or more holes extend through the flexible mounting band, and a fastener is provided through each of the one or more holes to the support structure.

4. The assembly of supported superconducting coils, according to claim 3, further comprising a reinforcement band provided over a part of the flexible mounting band, the reinforcement band being configured to cover the axial extent of the one or more holes and a region around the one or more holes.

5. The assembly of supported superconducting coils, according to claim 1, wherein the coil is a shield coil and the support structure is mounted to: a main magnet structure, a cryogen vessel, or an Outer Vacuum Chamber (OVC).

6. The assembly of supported superconducting coils, according to claim 1, wherein the coil is a main magnet coil and the support structure is mounted to a cryogen vessel or an Outer Vacuum Chamber (OVC).

7. The assembly of supported superconducting coils, according to claim 1, wherein the flexible mounting band is stiff in the axial direction while being compliant in the radial direction.

8. The assembly of supported superconducting coils, according to claim 3, wherein the one or more holes are provided near an axial end of the flexible mounting band.

9. The assembly of supported superconducting coils, according to claim 1, wherein the flexible mounting band is attached to a support structure by a continuous mechanical connection.

10. The assembly of supported superconducting coils, according to claim 1, wherein for the one or more other coils, the flexible mounting band is configured to extend beyond both radial extremities of the associated coil.

11. The assembly of supported superconducting coils, according to claim 1, further comprising annular connectors between the coil and the one or more other coils, wherein respective flexible mounting bands are connected to respective annular connectors at their axial extremities.

12. The assembly of supported superconducting coils, according to claim 11, wherein the annular connectors are configured as loadbearing supports to retain a magnet structure comprising the coil and the one or more other coils within a cryostat.

13. The assembly of supported superconducting coils, according to claim 1, wherein two or more coils are attached to a single shared flexible mounting band.

14. The assembly of supported superconducting coils, according to claim 2, wherein one or more holes extend through the flexible mounting band, and a fastener is provided through each of the one or more holes to the support structure.

15. The assembly of supported superconducting coils, according to claim 14, further comprising a reinforcement band provided over a part of the flexible mounting band, the reinforcement band being configured to cover the axial extent of the one or more holes and a region around the one or more holes.

16. The assembly of supported superconducting coils, according to claim 14, wherein the one or more holes are provided near an axial end of the flexible mounting band.

* * * * *